United States Patent [19]

Johnson

[11] 4,235,645
[45] Nov. 25, 1980

[54] PROCESS FOR FORMING GLASS-SEALED MULTICHIP SEMICONDUCTOR DEVICES

[75] Inventor: Joseph E. Johnson, Pittsburgh, Pa.

[73] Assignee: Westinghouse Electric Corp., Pittsburgh, Pa.

[21] Appl. No.: 970,045

[22] Filed: Dec. 15, 1978

[51] Int. Cl.³ .................. H01L 21/56; H01L 23/08
[52] U.S. Cl. ........................... 148/1.5; 29/580; 29/588; 65/32; 65/36; 65/54; 65/59 B; 148/187; 156/649; 156/662; 357/38; 357/55; 357/56; 357/73
[58] Field of Search ............ 148/1.5, 187; 427/279, 427/307; 29/580, 588; 357/55, 56, 38, 73; 65/32, 36, 54, 59 B; 156/648, 649, 662

[56] References Cited

U.S. PATENT DOCUMENTS

| | | | |
|---|---|---|---|
| 3,241,010 | 3/1966 | Eddleston | 357/73 |
| 3,271,124 | 9/1966 | Clark | 65/54 |
| 3,446,695 | 5/1969 | Janakirama-Rao | 65/59 R |
| 3,506,502 | 4/1970 | Nakamura | 148/1.5 X |
| 3,591,837 | 7/1971 | Boyer | 357/73 |
| 3,639,975 | 2/1972 | Tefft | 29/580 |
| 3,806,771 | 4/1974 | Petruzella | 357/73 X |
| 3,821,782 | 6/1974 | Hutson | 357/38 X |
| 4,007,476 | 2/1977 | Hutson | 357/73 X |
| 4,046,545 | 9/1977 | Sanford et al. | 65/32 X |
| 4,080,621 | 3/1978 | Funakawa et al. | 357/73 X |

Primary Examiner—R. Dean
Assistant Examiner—W. G. Saba
Attorney, Agent, or Firm—J. B. Hinson

[57] ABSTRACT

The preferred embodiment of the invention comprises a glass sealed thyristor and a method for simultaneously constructing a plurality of thyristors and a common semiconductor wafer. The thyristor utilizes a body of semiconductor material with the cathode and base regions extending to one major surface and the anode region extending to the second major surface. A groove is etched in the first surface of the body of semiconductor material to expose the PN junction formed at the interface of the cathode emitter and cathode emitter base regions. A second groove is etched in the second major surface to expose the PN junction formed at the interface of the anode emitter region and the anode emitter base region. Ring shaped glass members are fused to the body of semiconductor material to form seals providing environmental protection for the PN junctions exposed by etching the grooves in the major surfaces of the body of semiconductor material. A plurality of thyristors can be simultaneously constructed on a common semiconductor wafer.

6 Claims, 7 Drawing Figures

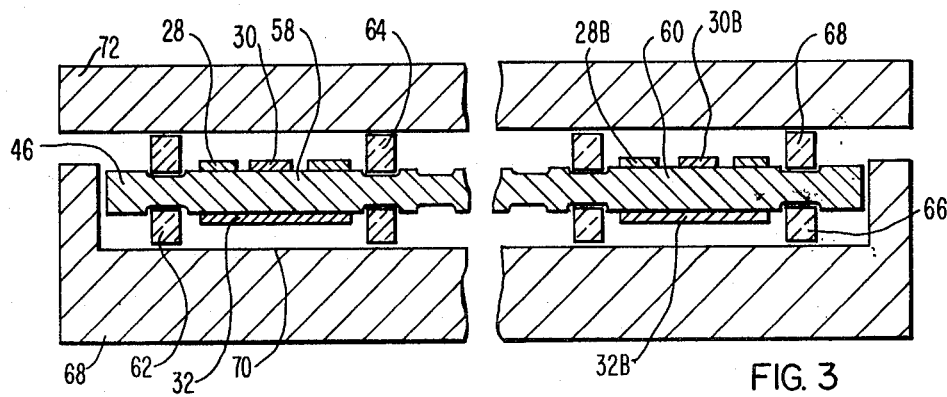
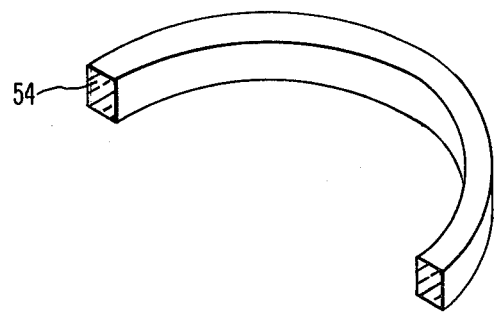
FIG. 3
FIG. 4

PROCESS FOR FORMING GLASS-SEALED MULTICHIP SEMICONDUCTOR DEVICES

BACKGROUND OF THE INVENTION

1. Field of the Invention

The invention relates to semiconductor devices and more specifically to semiconductor devices utilizing fused glass to form hermetic seals protecting the PN junctions and to a method for simultaneously constructing a plurality of devices on a common semiconductor wafer.

2. Description of the Prior Art

Prior art glass sealed thyristors, transistors and diodes have utilized a glass layer fused to the edge of the body of semiconductor material to form a seal protecting the PN junctions formed at the interface of regions of opposite conductivity type. A typical example of a prior art glass seal is disclosed in patent application entitled, "Glass Encapsulated Diode", by Bulent E. Yoldas, Ser. No. 897,323, now U.S. Pat. No. 4,168,960, and patent application entitled, "Glass Sealed Diode" by J. E. Johnson, Ser. No. 891,090, now U.S. Pat. No. 4,161,746, both of which are assigned to the same assignee as this application. These prior art devices utilized a body of semiconductor material having tapered edges. This results in a non-symmetrical device. Non-symmetry may increase stresses induced by changes in temperature. Additionally, the wafer was separated into individual devices prior to encapsulating the devices. This increased processing complexity in that the devices must be individually handled during the encapsulation process.

SUMMARY OF THE INVENTION

The invention comprises a semiconductor device such as a diode, transistor or thyristor, for example, and a method for manufacturing these devices. The semiconductor device includes a body of semiconductor material having first and second substantially flat opposed surfaces and an edge portion extending therebetween. The body of semiconductor material includes at least first and second regions of opposite conductivity type respectively extending to the first and second opposed major surfaces. A PN junction is formed at the interface of the regions of opposite conductivity type. A first groove is etched in the first surface of the body of semiconductor material such that the PN junction extends to and is exposed along the inner edge of the first groove. A second groove is etched in the second opposed surface of the body of semiconductor material. First and second preformed ring shaped glass members are disposed in the first and second grooves. The body of semiconductor material and the ring shaped glass preforms are disposed in a furnace and heated and cooled in a predetermined atmosphere in accordance with a preselected time temperature profile to fuse the glass comprising the preformed ring shaped glass member to the surface of the body of semiconductor material to form a seal protecting the PN junction. Electrodes are affixed to the regions of opposite conductivity type to complete the device.

BRIEF DESCRIPTION OF THE DRAWINGS

FIG. 3 is a drawing illustrating the use of a jig to support a semiconductor wafer and preformed ring shaped glass members such that the glass can be fused to the wafer.

FIG. 4 is a drawing of a preformed ring shaped glass member.

DESCRIPTION OF THE PREFERRED EMBODIMENT

Figure 1:
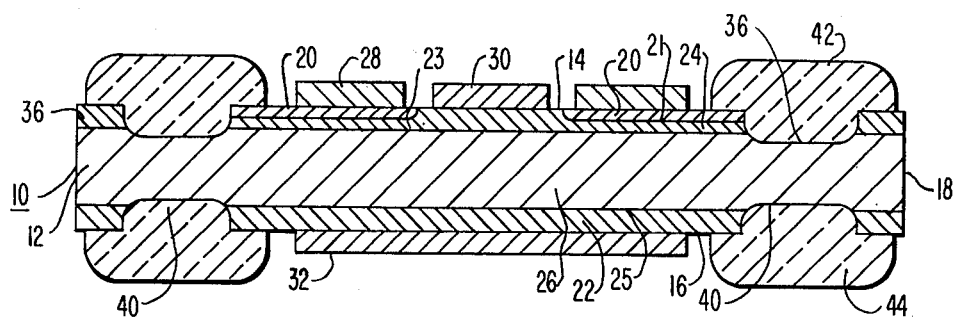
FIG. 1 is a cross-section drawing of a thyristor comprising the preferred embodiment of the invention.

FIG. 1 is a cross-section view taken along the diameter of a circular thyristor 10 comprising the preferred embodiment of the invention. The thyristor 10 utilizes a body of semiconductor material 12 having substantially flat opposed surfaces 14 and 16 and an edge portion 18 extending therebetween. The body of semiconductor material 12 includes cathode and anode emitter regions, 20 and 22, and cathode and anode emitter base regions 24 and 26. The cathode emitter region and the cathode emitter base region, 20 and 24, extend to the upper surface 14 of the body of semiconductor material 12. Similarly the anode emitter region 22 extends to the second major surface 16 of the body of semiconductor material 12. Cathode and gate electrodes, 28 and 30, are affixed to the cathode emitter region 20 and the cathode base region 24 along the first surface 14 of the body of semiconductor 12. Similarly an anode electrode 32 is affixed to the anode emitter region 22 along the second major surface 16 of the body of semiconductor material 12. A first groove 36 in the upper surface 14 of the body of semiconductor material 12 extends through the cathode emitter region 20 and the cathode emitter base region 24. First and second PN junctions, 21 and 23, respectively, formed at the interface of the cathode emitter region 20 and the cathode emitter base region 24 and at the interface of the cathode and anode emitter base regions, 24 and 26, extend to the inner edge of the groove 36. The second surface 16 of the body of semiconductor material 12 includes a second groove 40. Groove 40 extends through the anode emitter region 22. A third PN junction 25 formed at the interface of the anode emitter region 22 and the anode emitter base region 26 extends to the inner edge of the second groove 40.

A first ring shaped glass member 42 completely fills the first groove 36 and is fused to the upper surface 14, the body of semiconductor material 12 to form a hermetic seal protecting the first and second PN junctions, 24 and 23. A second ring-like glass member 44 similarly fills the second groove 40 and is fused to the second surface 16 of the body of semiconductor material 12 to form a seal protecting the third PN junction 25.

Figure 2:
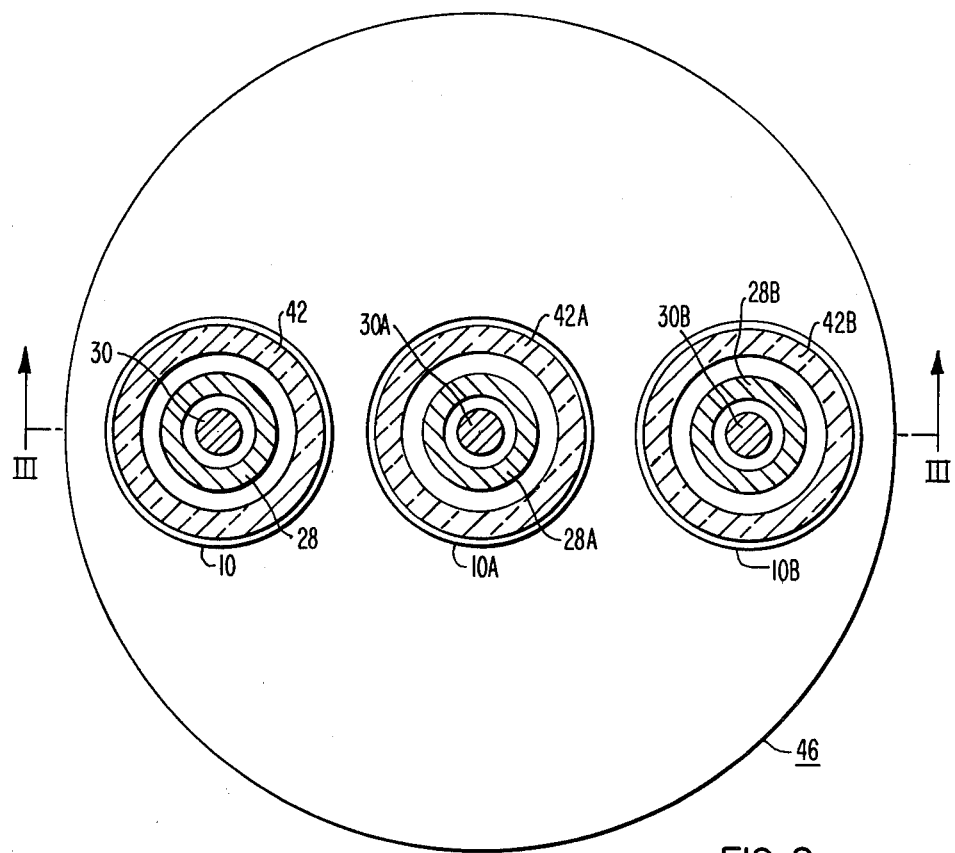
FIG. 2 is a top view of a semiconductor wafer containing a plurality of thyristors.

The preferred method of manufacturing the thyristor 10 illustrated in cross-section in FIG. 1 is to form a plurality of these thyristors on a common wafer 46 (FIG. 2) and separate the wafer to form the plurality of thyristors. FIG. 2 a top view of wafer 46 having three typical thyristors 10, 10a and 10b formed therein. The reference numerals 10, 10a and 10b are used to indicate that the three transistors are identical and that each of the transistors has a cross-section as illustrated in FIG. 1. Only three thyristors, 10, 10a and 10b, are illustrated in FIG. 2, however, any convenient number of thyristors can be made in a common wafer 46 with the limitation being the size of the individual thyristors and the size of the wafer 46.

Construction of the thyristors 10, 10a and 10b illustrated in FIGS. 1 and 2 begins with a conventional silicon wafer 46 of N conductivity type. Preferably the wafer 46 is in the range of three inches in diameter. The N conductivity type wafer 46 is disposed in a diffusion furnace and P conductivity dopants are diffused into each of the major surfaces to form thin P conductivity type regions. Following formation of the P conductivity type regions, one of the surfaces is completely protected by a photoresist layer while the second surface is patterned to form protective layers overlying the gate contact area of the thyristors 10, 10a and 10b. Following the masking step, N conductivity type dopants are diffused into the exposed portions of one surface of the wafer 46 to produce the cathode emitter regions, a typical cathode emitter region being illustrated at reference numeral 20 (FIG. 1), of the individual thyristors.

Following the diffusion steps outlined above the making layers are removed and the gate, anode and cathode electrodes are affixed to the individual thyristors utilizing well-known electrodeless nickel brazing process. After the electrodes have been affixed grooves along the outer edge of each of the thyristors 10, 10a and 10b are etched entirely through the anode emitter as well as the cathode emitter and the cathode emitter base regions using conventional etching processes. These grooves correspond to grooves 36 and 40 illustrated in FIG. 1. After the grooves along the outer edge of each of the thyristors 10, 10a and 10b have been etched the PN junctions formed at the interfaces of the cathode emitter and cathode emitter base region, the cathode emitter base region with the anode emitter base region, as well as the anode emitter and anode emitter base regions are exposed along the inner edge of the grooves. Preformed glass ring shaped members are disposed in the grooves assembled in a jig as illustrated in FIG. 3, placed in a furnace and fused to the surfaces of the wafer 46 to form protective layers protecting the PN junctions. This fusion process is carried out using thin preformed glass rings with a typical preformed glass ring 54 separately illustrated in FIG. 4.

Suitable electrodeless nickel brazing processes are well known to those skilled in the art. The cathode, gate and anode electrodes 28, 30 and 32 are metal and may be molybdenum, for example.

FIG. 3 is a partial cross-section drawing of the silicon wafer 46 after the diffusion and etching steps have been completed and the electrodes have been affixed and the wafer 46 assembled in a jig in combination with preformed ring shaped glass members 62, 64, 66 and 68. The jig provides support for the semiconductor wafer 46 and the preformed ring shaped glass members during the fusion process. Only portions of the silicon wafer 46 are illustrated in FIG. 3 in order to simplify the illustration. Typical first and second portions of the wafer 46 are illustrated at reference numerals 58 and 60. The portions of wafer 46 which are illustrated in FIG. 3 correspond to thyristor 10 and 10b of FIG. 2.

The first portion 58 has a first preformed ring shaped glass member 62 positioned in the groove in the lower surface thereof. Similarly, a second preformed ring shaped glass member 64 is positioned in the groove in the upper surface of the first portion 58 of the silicon wafer 46. The second portion 60 of the body of semiconductor material 46 has a first preformed ring-shaped glass member 66 and second preformed ring shaped glass member 68 similarly positioned in the grooves in the lower and upper surfaces of the wafer 46. The wafer 46 and the preformed ring shaped glass members 62, 64, 66 and 68 are supported in a jig which includes a lower member 68 having a recess 70 therein. The recess 70 has a diameter slightly larger than the diameter of the wafer 46. The jig includes a top member 72 which is positioned in overlying relationship with the preformed ring shaped glass members 64 and 68. The dimensions of the glass preform 62, 64, 66 and 68 are selected such that when assembled as shown in FIG. 3 the preformed ring shaped glass members 62, 64, 66 and 68 extend slightly above the top and bottom surfaces of the wafer 46. The silicon wafer 46 and the preformed ring shaped glass members 62, 64, 66 and 68 as assembled in the jig are placed in the furnace and the preformed ring shaped glass members 62, 64, 66 and 68 are fused to the top and bottom surfaces of the semiconductor wafer 46 to form seals protecting the PN junctions of the thyristors which are exposed along the edges of the grooves as previously described.

The first step in fusing the ring glass members 62, 64, 66 and 68 to the wafer 46 is to clean all the components using the following procedures:

(a) Boil all the components in reagent grade trichloroethylene.

(b) Rinse all components twice (one minute each time) in reagent grade trichloroethylene.

(c) Rinse all the components ultrasonically twice (one minute each time) in reagent grade acetone and (d) Dry in room air on filter paper.

Following cleaning the components are assembled in a jig as previously described and placed in a furnace.

The initial temperature of the furnace is in the range of 350° C. An atmosphere preferably consisting of an inert gas, preferably nitrogen and water vapor, except for incidental impurities, is established in the furnace. The total pressure of the furnace is preferably one atmosphere with the partial pressure of the water vapor being in the range of $10^{-3}$ to $10^{-2}$ atmospheres. The desired water vapor is achieved by mixing approximately 2 parts of dry nitrogen with 1 part of wet nitrogen and flowing the mixture through the furnace. Dry nitrogen is passed through one inch of the ionized water in a bubbler to form the required wet nitrogen. After the required atmosphere has been established the temperature of the furnace is increased and decreased in accordance with a time temperature chart illustrated in FIG. 5.

Figure 5:
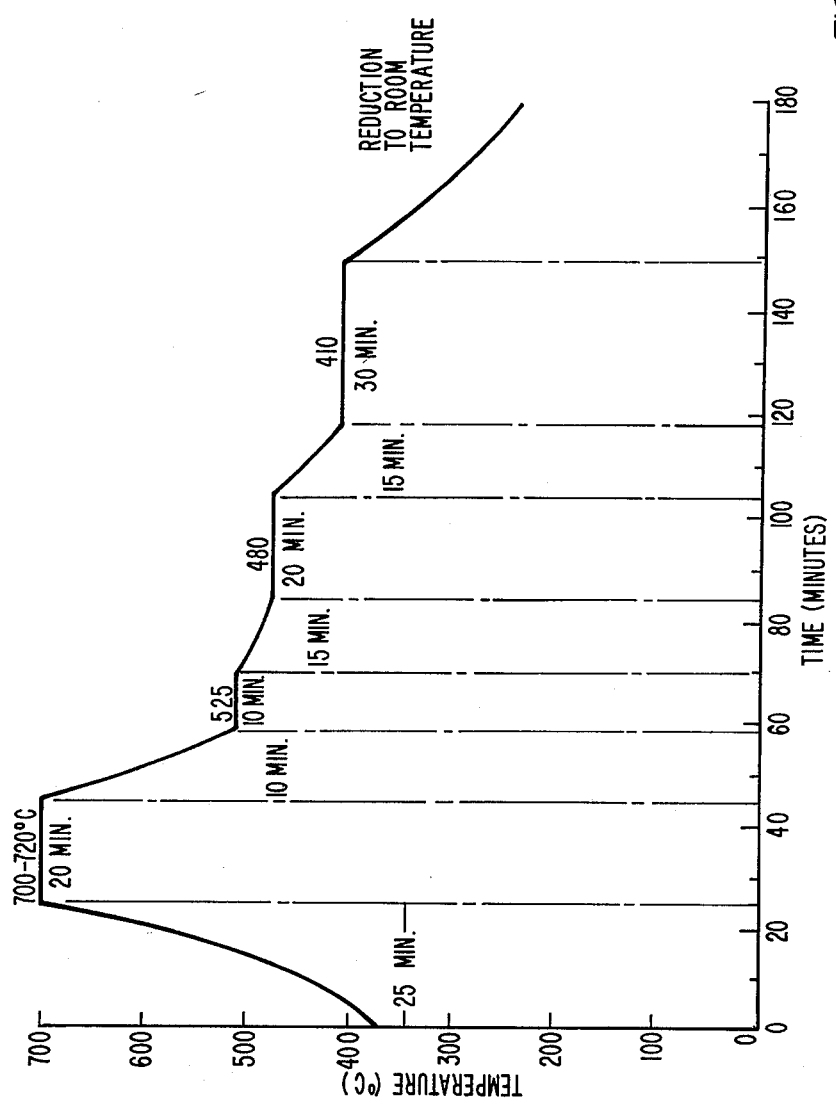
FIG. 5 is a time temperature profile of the furnace used to fuse the preformed ring shaped glass members to the semiconductor wafer.

As can be seen from FIG. 5 the temperature of the furnace is initially at about 350° C. The temperature is increased to the range of 700° to 720° C. in a time interval of 25 minutes. This temperature is maintained for a period of approximately 20 minutes. Preformed ring shaped glass members 62, 64, 66 and 68 melt at a temperature below 700° C., therefore, maintaining the temperature of the furnace in the range of 700° to 720° C. for 20 minutes causes the glass to melt forming a high viscosity mass. Pressure due to top plate 72 of the jig causes the molten glass to flow evenly along the grooves and fuse to the surface of the semiconductor wafer 46. The depth of the recess 70 in base member 68 is selected such that after fusion the ring shaped glass members 42 and 44 extend above the surfaces of the body of semiconductor material 12.

Next the furnace is cooled from 720° to approximately 525° C. in approximately 10 minutes. The temperature of 525° C. is maintained for approximately 10 minutes followed by a reduction to 480° C. in about 15 minutes. A temperature of 480° C. is maintained for 20 minutes followed by a reduction to 410° C. in a period of 15 minutes. The temperature of 410° C. is maintained for 30 minutes followed by a reduction in the furnace temperature to room temperature at a rate in a range of 10° per minute. This thermal cycle prevents harmful stresses developing in the glass.

Following the above fusion process the wafer 46 is separated using a cavitron dicer to form the individual thyristors. The first and second portions of the semiconductor wafer 46 become thyristors 10 and 10b, illustrated in FIG. 2.

The selection of a glass for the preformed ring shaped glass members 62, 64, 66 and 68 is important that the temperature expansion coefficient of the glass be compatible with that of the semiconductor wafer 46. The glass is suitable for use in the thyristor comprising this invention have a temperature expansion coefficient in the range of 4.0 to 6.0 times $10^{-6}$ centimeters per centimeter per degree C. and should be substantially free of alkaline ions. The preferred method of making the preformed ring shaped glass members is to slice stress relieved glass tubing. Preformed ring shaped glass members formed by this method are dense, substantially free of harmful contaminants and of uniform quality. In addition (1) The glass must have structural stability, e.g., must not devitrify or go through phase separation during the fusion process.

(2) The glass must have good chemical resistance to the environment and humidity.

(3) The glass must have thermal expansion characteristics compatible with those of semiconductor wafer.

(4) The glass must wet and adhere to the semiconductor wafer.

(5) The glass must have a viscosity low enough to flow.

(6) The glass must not chemically attack the surfaces of the semiconductor water in a detrimental way.

(7) The thermal characteristics of the glass must be such that stresses can be relieved at temperatures within the limitations of the device.

(8) The glass must have a fusion temperature below the degradation temperature of the device.

(9) The finished device must be resilient to thermal shock and thermal cycling and must have good mechanical strength.

Glasses having a chemical composition by weight of

| Constituent | Percentage |
|---|---|
| SiO$_2$ | 3–40 |
| B$_2$O$_3$ | 12–23 |
| PbO | 40–48 |
| Al$_2$O$_3$ | 2–6 | have been found to be suitable.

In particular a glass having a composition of constituent and percent by weight, SiO$_2$, percent 36%±4%, B$_2$O$_3$, 15%±3%, PbO, 45%±3%, Al$_2$O$_3$, 3%±1% have been found to be particularly satisfactory. This glass is sold commercially by Inotec under the type number IP745.

Figure 6:
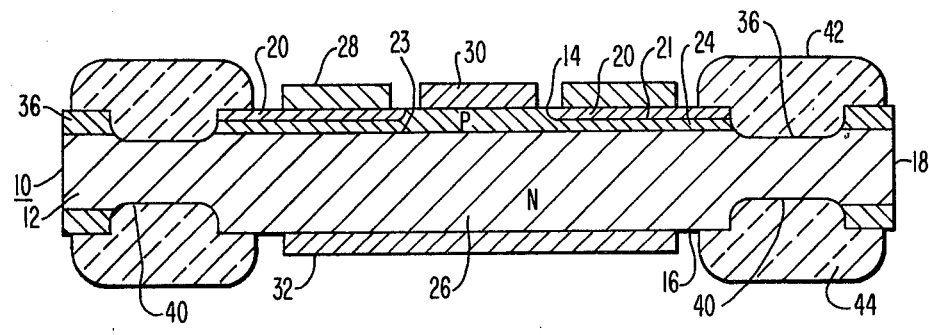
FIG. 6 is a cross-section drawing of a transistor.

The thyristor 10 (FIG. 1) can be easily modified to form a transistor for example, by deleting the anode emitter region 22. This is accomplished by completely protecting one surface of the wafer during the initial diffusion process, previously described. When so modified the cathode emitter region 20, the cathode emitter base region 24 and the anode emitter base region 26, respectively become the emitter, base and collector region of the transistor. The thyristor 10 modified to form a transistor is illustrated in FIG. 6.

Figure 7:
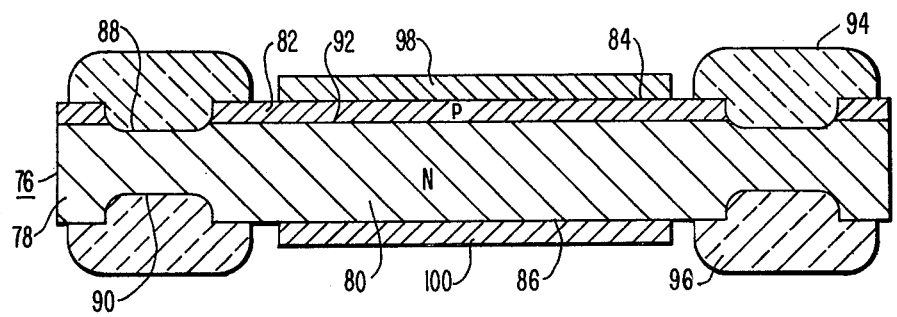
FIG. 7 is a cross-section drawing of a diode.

The thyristor 10 can also be easily modified to form a diode 76 as illustrated in FIG. 7. The diode 76 includes a body of semiconductor material 78 having an N conductivity type region 80 and a P conductivity type region 82 therein. The N and P conductivity type regions, 80 and 82, respectively extend to the upper and lower surfaces, 84 and 86, of the body of semiconductor material 78. Upper and lower surfaces of the body of semiconductor material 78 include first and second grooves, 88 and 90. A PN junction 92 formed at the interface of P and N conductivity type regions, 80 and 82, extends to the inner edge of the groove 88 in the top surface 84 of the body of semiconductor material 78. A first ring shaped electrically insulating glass members 94 fills the first groove 88 in the top surface 84 of the body of semiconductor material 78 and is fused to the upper surface 84 to form a seal protecting the PN junction 92. A second ring shaped electrically insulating glass member 96 fills the second groove 90 and is fused to the second surface 86 of the body of semiconductor material 76. First and second electrodes 98 and 100 are affixed to the N and P conductivity type regions 82 and 80 to complete the diode 96.

The modification of the process described above for constructing thyristor 10 to construct the diode 76 consist of modifying the diffusion steps to produce the N and P conductivity type regions 80 and 82 and affixing only one electrode 98 to the upper surface 84 of the body of semiconductor material 78 instead of the gate and cathode electrodes of thyristor 10. The details of the necessary modifications are believed to be obvious to one skilled in the art and will not be described in detail.

What is claimed is:

1. A method for constructing a semiconductor device comprising the steps of:
   (a) forming at least two regions of opposite conductivity in a body of semiconductor material, said body of semiconductor material including first and second substantially flat opposed surfaces and an edge portion extending therebetween;
   (b) etching a first groove in said first opposed surface such that a PN junction formed at the interface of said two regions of opposite conductivity type extends to an inner edge of said first groove;
   (c) etching a second groove in said second substantially flat opposed surface of said body of semiconductor material;
   (d) disposing first and second preformed ring shaped glass members in said first and second grooves;
   (e) disposing said body of semiconductor material and said preformed ring-shaped glass members, as assembled, in a furnace and fusing said preformed ring shaped glass members to said body of semiconductor material to form a seal protecting said portion of said PN junction which extends to said inner edge of said first groove.

2. A method for constructing a semiconductor device in accordance with claim 1 further including the step of establishing a predetermined atmosphere consisting of a mixture of an inert gas and water vapor in said furnace prior to fusing said preformed ring-shaped glass member to said body of semiconductor material.

3. A method for constructing a semiconductor device in accordance with claim 2 wherein said inert gas is selected from a group consisting of nitrogen, helium and argon.

4. A method for constructing a semiconductor device in accordance with claim 3 wherein said inert gas is nitrogen.

5. A method for constructing a semiconductor device in accordance with claim 4 wherein said predetermined atmosphere has a total pressure in the order of one atmosphere.

6. A method for constructing a semiconductor device in accordance with claim 5 wherein said water vapor is produced by passing dry nitrogen through a bubbler to produce wet nitrogen and combining said wet nitrogen with dry nitrogen.

* * * * *